(12) United States Patent
Sun

(10) Patent No.: US 12,193,268 B2
(45) Date of Patent: Jan. 7, 2025

(54) ORGANIC LIGHT-EMITTING DIODE DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Yexi Sun, Wuhan (CN)

( * ) Notice: Subject to any disclaimer, the term of this patent is extended or adjusted under 35 U.S.C. 154(b) by 0 days.

(21) Appl. No.: 17/622,828

(22) PCT Filed: Dec. 23, 2021

(86) PCT No.: PCT/CN2021/140709
§ 371 (c)(1),
(2) Date: Dec. 26, 2021

(87) PCT Pub. No.: WO2023/103101
PCT Pub. Date: Jun. 15, 2023

(65) Prior Publication Data
US 2024/0032334 A1 Jan. 25, 2024

(30) Foreign Application Priority Data
Dec. 10, 2021 (CN) .......................... 202111503082.8

(51) Int. Cl.
*H10K 59/121* (2023.01)
*H10K 59/131* (2023.01)
(Continued)

(52) U.S. Cl.
CPC ......... *H10K 59/121* (2023.02); *H10K 59/131* (2023.02); *H10K 59/65* (2023.02);
(Continued)

(58) Field of Classification Search
CPC .......................... H10K 59/121; H10K 59/131
See application file for complete search history.

(56) References Cited

U.S. PATENT DOCUMENTS

| | | | |
|---|---|---|---|
| 2015/0041791 A1 | 2/2015 | Lee et al. | |
| 2017/0279067 A1 | 9/2017 | Ushikubo et al. | |
| 2023/0045264 A1* | 2/2023 | Wang | H01L 27/124 |

FOREIGN PATENT DOCUMENTS

| | | |
|---|---|---|
| CN | 109801950 A | 5/2019 |
| CN | 109949711 A | 6/2019 |

(Continued)

*Primary Examiner* — Douglas M Menz

(57) ABSTRACT

An organic light-emitting diode display panel and a display device are provided in the present disclosure. The organic light-emitting diode display panel includes a general display region and a light-transmitting display region, wherein the light-transmitting display region corresponds to an under-screen camera placement region; the organic light-emitting diode display panel further includes an array unit and a light-emitting unit disposed on an upper side of the array unit, and the light-emitting unit includes a cathode layer disposed on a surface of the array unit. The cathode layer includes a second cathode portion corresponding to the light-transmitting display region, and a first cathode portion corresponding to the general display region, and the second cathode portion and the first cathode portion are disconnected from each other to connect different voltages respectively.

20 Claims, 5 Drawing Sheets

(51) Int. Cl.
*H10K 59/65* (2023.01)
*H10K 59/80* (2023.01)
*H10K 77/10* (2023.01)
*H10K 102/00* (2023.01)

(52) U.S. Cl.
CPC ......... *H10K 59/873* (2023.02); *H10K 77/111* (2023.02); *H10K 2102/311* (2023.02)

(56) References Cited

FOREIGN PATENT DOCUMENTS

| | | | |
|---|---|---|---|
| CN | 111029381 A | 4/2020 | |
| CN | 111341820 A | 6/2020 | |
| CN | 111725287 A | 9/2020 | |
| CN | 111785853 A | 10/2020 | |
| CN | 111969027 A | 11/2020 | |
| CN | 112151696 A | 12/2020 | |
| CN | 112750965 A | 5/2021 | |
| CN | 112838105 A | 5/2021 | |
| CN | 113299859 A | 8/2021 | |

* cited by examiner

ORGANIC LIGHT-EMITTING DIODE DISPLAY PANEL AND DISPLAY DEVICE

FIELD DISCLOSURE

The present disclosure relates to the field of displays, and in particular to an organic light-emitting diode (OLED) display panel and a display device.

BACKGROUND OF DISCLOSURE

In recent years, pursuit for high screen-to-body ratio and "full screen" with extremely narrow bezel has become a hotspot in the field of small size display screens. An advantage of "full screen" is to maximize the use of a display region of screens and brings a better visual experience for users. A position problem of placing front cameras, ambient light sensors, receivers, and other photosensitive devices in an upper front portion of mobile phones is a difficult point in designs of "full screen". In punch hole screens with notch shapes, water drop shapes, and round shapes, the screen-to-body ratio still decreases since a punch hole region for placing front camera elements lacks pixels and does not have a display function. Currently, a new technology of under-screen cameras utilizes an organic light-emitting diode (OLED) display screen design with the high screen-to-body ratio, wherein the screen has pixels corresponding to regions where the camera is placed, and also has the display function, so as to improve integrity of the screen display.

SUMMARY OF INVENTION

Technical Problems

For an organic light-emitting diode (OLED) full screen, a region usually for placing under-screen cameras is called a light-transmitting display region, and other regions except for the light-transmitting display region are general display regions. In the current technology of the under-screen cameras, in order to ensure brightness in the light-transmitting display region consistent with the general display regions, the size of anode electrodes in the light-transmitting display region is usually decreased. However, the anode in the light-transmitting display region and the anode in the general display regions are connected to a single cathode layer on the whole surface, which will cause the current density of the light-transmitting display region to increase, thereby leading to a significant increase in overall screen power consumption.

Technical Solutions

The present disclosure provides an organic light-emitting diode (OLED) display panel and a display device to solve the problem that a significant increase in overall screen power consumption is caused by an electric potential of a display region consistent with an electric potential of an under-screen camera placement region.

In order to solve the above problems, the technical solutions provided by the present disclosure are as below.

An organic light-emitting diode display panel, includes:
a general display region and a light-transmitting display region, wherein the light-transmitting display region corresponds to an under-screen camera placement region;

the organic light-emitting diode display panel further includes an array unit and a light-emitting unit disposed on an upper side of the array unit, and the light-emitting unit includes a cathode layer disposed on a surface of the array unit, wherein the cathode layer includes a first cathode portion corresponding to the general display region, a second cathode portion corresponding to the light-transmitting display region, and the second cathode portion and the first cathode portion are disconnected from each other to connect different voltages respectively.

In some embodiments of the present disclosure, a groove is provided between the first cathode portion and the second cathode portion, and the first cathode portion and the second cathode portion are disconnected from each other by the groove.

In some embodiments of the present disclosure, the light-transmitting display region is located within a frame region surrounded by the general display region or the light-transmitting display region is located outside the frame region surrounded by the general display region, and the light-transmitting display region and the general display region jointly form one frame region.

In some embodiments of the present disclosure, the organic light-emitting diode display panel includes a bezel region located at an external side of the general display region, a first wire and a second wire are provided in a structural layer corresponding to the bezel region of the organic light-emitting diode display panel, the first wire and the first cathode portion are conductively connected and connected to a first power source, and the second wire and the second cathode portion are conductively connected and connected to a second power source.

In some embodiments of the present disclosure, a fan-out region is provided on a side of the bezel region, the first wire and the second wire both extend from the bezel region to the fan-out region, and the first wire and the second wire are connected to the first power source and the second power source respectively through the fan-out region.

In some embodiments of the present disclosure, the array unit includes a source-drain layer, and the first wire, the second wire, and the source-drain layer are located at the same layer.

In some embodiments of the present disclosure, the first wire and the second wire are arranged in parallel and spaced apart from each other, and a projection of the first wire in the bezel region is closer to the general display region than a projection of the second wire in the bezel region.

In some embodiments of the present disclosure, the light-emitting unit includes an anode layer, an organic light-emitting layer disposed on a surface of the anode layer, and the cathode layer disposed on a surface of the organic light-emitting layer, wherein the anode layer in the light-transmitting display region includes a third wire extending from the light-transmitting display region to the bezel region, and the second cathode portion is conductively connected to the second wire through the third wire and a first via hole arranged in the array unit.

In some embodiments of the present disclosure, the light-emitting unit further includes a packaging layer located on a side of the cathode away from the anode layer, and the packaging layer further covers a surface of the third wire exposed by the cathode layer, and a surface of the array unit exposed by the third wire.

In some embodiments of the present disclosure, the second wire includes a second left wire, a second right wire, and a connecting portion between the second left wire and the second right wire, a projection of the connecting portion on a display surface of the organic light-emitting diode display panel is opposite to an upper edge of the light-transmitting display region, and the second cathode portion is conductively connected to the connecting portion through the third wire and the first via hole arranged in the array unit.

In some embodiments of the present disclosure, the third wire extends above the connecting portion, a projection of the third wire on the array unit at least partially overlaps a projection of the connecting portion above the array unit.

In some embodiments of the present disclosure, the array unit includes a flexible substrate, a buffer layer located on a surface of the flexible substrate, an array layer located on a surface of the buffer layer, and a flat layer located on a surface of the array layer, wherein the array layer includes a source-drain layer, and the first via hole penetrates the flat layer and connect the connecting portion.

In some embodiments of the present disclosure, the first wire is provided with an opening, the second wire includes a second left wire, a second right wire, and a connecting portion located in the opening and connecting the second left wire and the second right wire, a projection of the connecting portion on a display surface of the organic light-emitting diode display panel is opposite to an upper edge of the light-transmitting display region, and the second cathode portion is conductively connected to the connecting portion through the third wire and a second via hole arranged in the array unit.

In some embodiments of the present disclosure, the array unit includes a plurality of thin-film transistors, the organic light-emitting layer includes a plurality of light-emitting pixels, the light-emitting pixels are distributed in the general display region and the light-transmitting display region, and the light-emitting pixels in the light-transmitting display region are driven by the thin-film transistors in the general display region.

In some embodiments of the present disclosure, the anode layer includes a plurality of anode electrodes spaced apart from each other, the anode electrodes correspond to the light-emitting pixels one by one, and a size of the anode electrodes in the light-transmitting display region is smaller than a size of the anode electrodes in the general display region.

In some embodiments of the present disclosure, the light-emitting unit in the light-transmitting display region further includes a light-transmitting metal layer located between the array unit and the anode layer, and the light-transmitting metal layer is connected to the light-emitting pixels in the light-transmitting display region and the thin-film transistors in the light-transmitting display region.

In some embodiments of the present disclosure, a first conductive hole is provided in the flat layer, and the light-emitting pixels in the general display region are connected to the source-drain layer through the first conductive hole.

In some embodiments of the present disclosure, a second conductive hole is provided in the flat layer, and the light-transmitting metal layer is connected to the source-drain layer through the second conductive hole.

In some embodiments of the present disclosure, a thickness of the light-emitting unit in the light-transmitting display region is same as a thickness of the light-emitting unit in the general display region.

A display device includes the OLED display panel as described in any one of the above.

The beneficial effects of the present disclosure are as below. Since the organic light-emitting diode (OLED) display panel provided by the present disclosure includes a general display region and a light-transmitting display region, wherein the light-transmitting display region corresponds to an under-screen camera placement region; the OLED display panel further includes an array unit and a light-emitting unit disposed on a surface of the array unit, and the light-emitting unit includes a cathode layer disposed on a surface of the array unit, wherein the cathode layer includes a second cathode portion corresponding to the light-transmitting display region, and a first cathode portion corresponding to the general display region, and the second cathode portion and the first cathode portion are disconnected from each other to connect different voltages respectively, so that it can provide an independent power source for light-transmitting display region and achieve a purpose of reducing screen power consumption successively.

Beneficial Effects

The present disclosure provides a display module and a seamless splicing display device formed by the display module. A compensation display assembly is provided in a bezel region of a display panel included in the display module, and a bezel driving circuit for controlling the compensation display assembly is provided on a surface of the display panel. A metal wire is provided on a side of the display panel, and the metal wire is electrically connected to the compensation display assembly and the bezel driving circuit, thereby simplifying a control circuit structure of the compensation display assembly and making a thickness of the display module thinner.

BRIEF DESCRIPTION OF DRAWINGS

In order to clearly illustrate the technical solutions in the embodiments of the present disclosure, the drawings used in the description of the embodiments will be briefly introduced below. Obviously, the drawings in the following description are only some embodiments of the disclosure. Other drawings can also be obtained from those skilled in the art based on these drawings without paying any inventive effort.

DETAILED DESCRIPTION OF EMBODIMENTS

Figure 1:
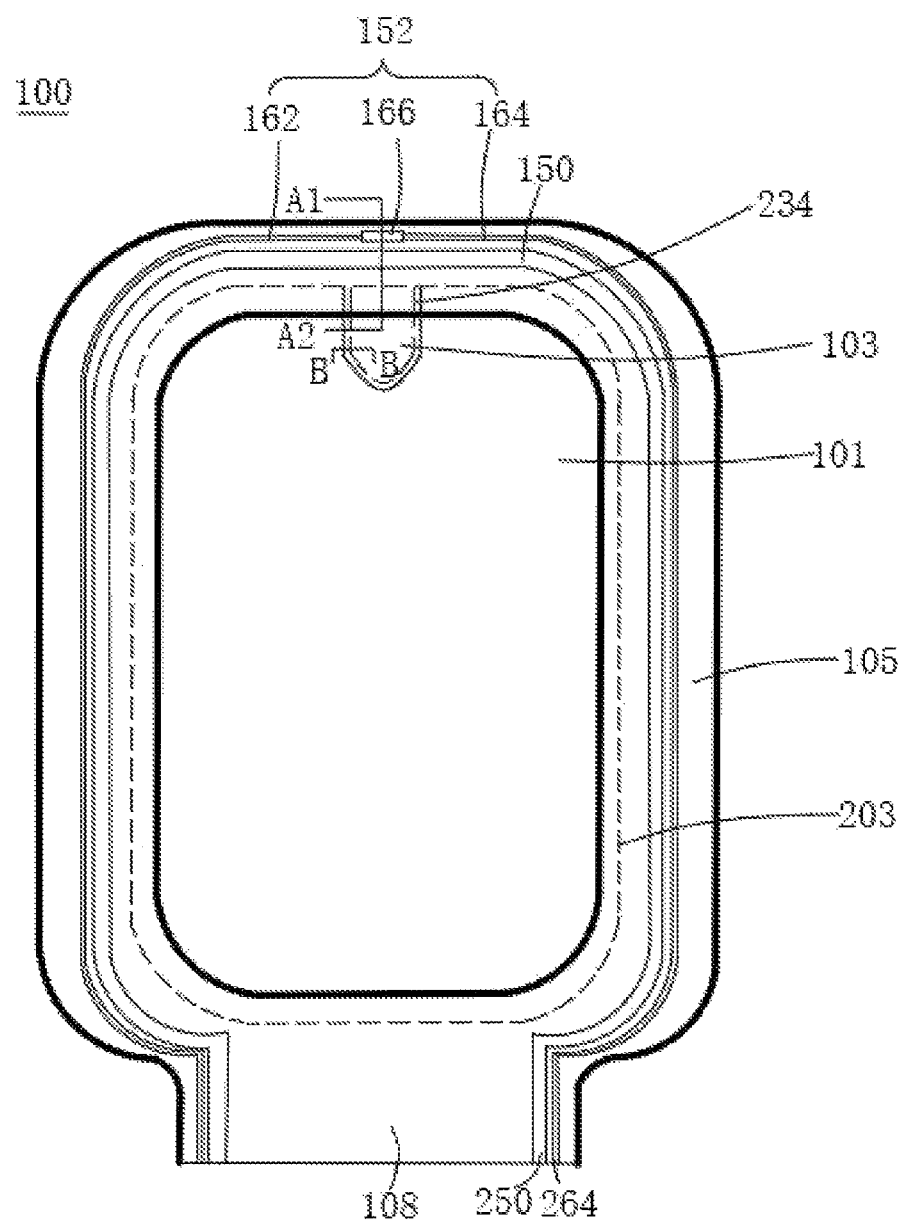
FIG. 1 is a top view of a layer structure included in an organic light-emitting diode (OLED) display panel provided by a first embodiment of the present disclosure.

The technical solutions in the embodiments of the present disclosure are clearly and completely described in the following description, which is combined with the drawings in the embodiments of the present disclosure. Obviously, the embodiments described in the following description are only a part of the embodiments of the disclosure, not all the embodiments. Other embodiments obtained from those skilled in the art based on the embodiments of the present disclosure without paying any inventive effort belong to a protected scope of the present disclosure.

In the present disclosure, it is realized that the direction and position relationship indicated by the terms, such as "upper", "lower", etc., are direction and position relationship based on the drawings of this disclosure. The terms only facilitate describing the present disclosure and simplifying the description, not indicate or imply that the devices or elements must have a specific direction, be configured, and operated in a specific direction. Therefore, the terms should not be realized to limit the present invention. Moreover, the terms "first" and "second" are used for descriptive purposes only, and cannot be realized as indicating or implying relative importance or implying the number of indicated technical features. Thus, the technical features defined as "first" and "second" may explicitly or implicitly include one or more of the technical features. In the description of the present disclosure, a meaning of "a plurality of" is two or more, unless specifically defined.

The present disclosure may repeat reference numerals and/or reference letters in different examples, such repetition is used for the purpose of simplicity and clarity and not in itself indicative of the relationship between various discussed embodiments and/or settings.

Please refer to FIG. 1. FIG. 1 is an organic light-emitting diode (OLED) display panel 100 provided by the present disclosure. The OLED display panel 100 includes a general display region 101 and a light-transmitting display region 103. The general display region 101 and the light-transmitting display region 103 jointly form a display region of the OLED display panel 100. The general display region 101 refers to a region where light-emitting pixels are normally disposed, and the light-transmitting display region 103 corresponds to an under-screen camera placement region. The light-transmitting display region 103 may be located within a frame region surrounded by the general display region 101 or the light-transmitting display region 103 may be located outside the frame region surrounded by the general display region 101. The light-transmitting display region 103 and the general display region 101 jointly form one frame region (such as a region surrounded by black bold lines inside a dotted box shown in FIG. 1).

Figure 2:
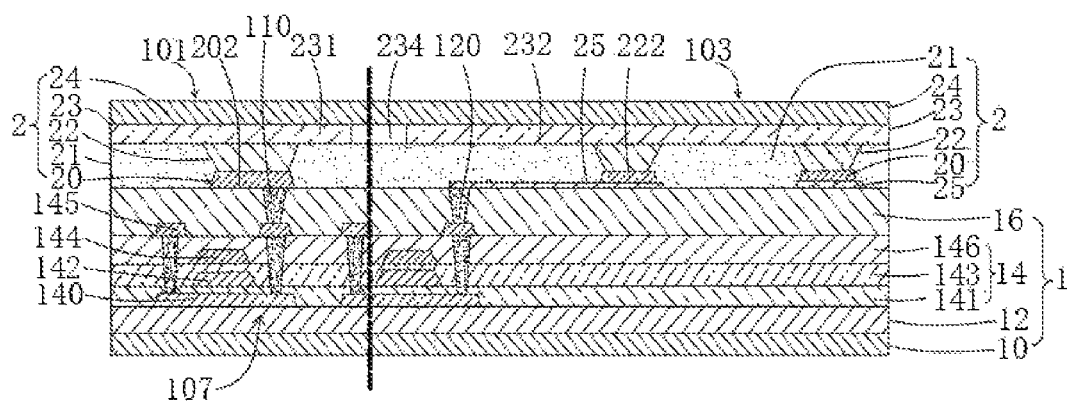
FIG. 2 is a section view along a B-B direction of the OLED display panel provided by FIG. 1.
Figure 3:
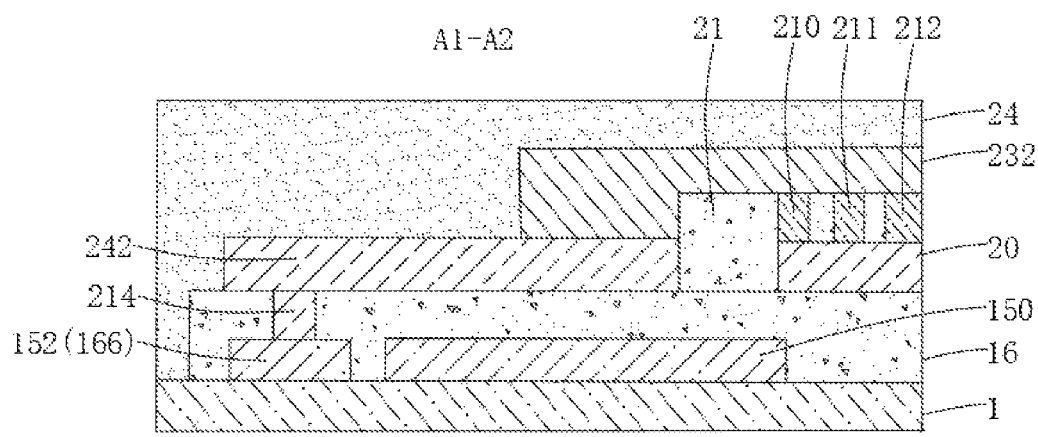
FIG. 3 is a section view along an A1-A2 direction of the OLED display panel provided by FIG. 1.

Please refer to FIGS. 2-3 together. The OLED display panel 100 further includes an array unit 1 and a light-emitting unit 2 disposed on a surface of the array unit 1. The light-emitting unit 2 includes a cathode layer 23 disposed above the array unit 1. The cathode layer 23 includes a first cathode portion 231 located in the general display region 101 and a second cathode portion 232 located in the light-transmitting display region 103. The second cathode portion 232 and the first cathode portion 231 are disconnected from each other to connect different voltages respectively, so that the second cathode portion 232 can provide an independent power source for the light-transmitting display region 103 and achieve a purpose of reducing screen power consumption. The present disclosure is illustrated below in combination with specific embodiments.

Embodiment 1

Please refer to FIG. 1 and FIG. 2. Specifically, an OLED display panel 100 also includes an array unit 1 and a light-emitting unit 2 in a thickness direction.

A display surface of the OLED display panel 100 in functional regions is divided into a general display region 101, a light-transmitting display region 103, a bezel region 105 located on an external side of the general display region 101, and a fan-out region 108 on a side of the general display region 101 away from the light-transmitting display region 103. The general display region 101 refers to other parts in the display region of the OLED display panel 100 except for the light-transmitting display region 103. That is, the light-transmitting display region 103 is also a part of the display region of the OLED display panel 100, the general display region 101 and the light-transmitting display region 103 jointly form the display region of the OLED display panel, and achieve a full-screen display of the OLED display panel. The shapes of the light-transmitting display region 103 can be but not limited to round, square, oval, irregular shapes, and so on.

The array unit 1 includes a flexible substrate 10, a buffer layer 12 located on a surface of the flexible substrate 10, an array layer 14 located on a surface of the buffer layer 12, and a flat layer 16 located on a surface of the array layer 14.

The array layer 14 includes a semiconductor layer 140, a first interlayer insulating layer 141 located on a surface of the semiconductor layer 140, a first metal circuit layer 142 located on a surface of the first interlayer insulating layer 141, a second interlayer insulating layer 143 located on a surface of the first metal circuit layer 142, a second metal circuit layer 144 located on a surface of the second interlayer insulating layer 143, a dielectric layer 146 located on a surface of the second metal circuit layer 144, and a source-drain layer 145 located above the dielectric layer 146.

A plurality of thin-film transistors 107 are included in the array unit 1. The source-drain layer 145 includes a source and a drain.

The light-emitting unit 2 in the general display region 101 includes an anode layer 20, a pixel definition layer 21, an organic light-emitting layer 22, a cathode layer 23, and a packaging layer 24. The material of the anode layer 20 and the cathode layer 23 is preferably Mg/Ag material. Please refer to FIG. 3 together. In the present embodiment, the packaging layer 24 further covers a surface of the third wire 242 exposed by the cathode layer 23 and a surface of the array unit 1 exposed by the third wire 242.

The organic light-emitting layer 22 includes a first light-emitting pixel 210, a second light-emitting pixel 211, and a third light-emitting pixel 212. The light-emitting pixels in the general display region 101 are conductively connected to the drain included in the source-drain layer 145 by a first conductive hole 110 penetrating the flat layer 16.

The light-emitting unit 2 in the light-transmitting display region 103 includes a light-transmitting metal layer 25, the anode layer 20, the pixel definition layer 21, the organic light-emitting layer 22, the cathode layer 23, and the packaging layer 24. That is, the light-transmitting display region 103 has one more light-transmitting metal layer compared to the general display region 101. The light-transmitting metal layer 25 is used to connect the light-emitting pixels in the light-transmitting display region 103 and the thin-film transistors 107 at the edges of the light-transmitting display region 103 through a second conductive hole 120 penetrating the flat layer 16. The light-transmitting metal layer 25 is preferably a metal with high light transmittance, which not only does not affect the transmittance of the light incident on the under-screen camera, but also can realize electrical conductivity. The metal with high light transmittance is preferably indium tin oxide (ITO) or indium zinc oxide (IZO), etc.

Although the light-transmitting display region 103 has one more light-transmitting metal layer 25 compared to the general display region 101, a thickness of the light-emitting unit 2 in the light-transmitting display region 103 is consistent with a thickness of the light-emitting unit 2 in the general display region 101. That is, the same structure layers of the light-transmitting display region 103 and the general display region 101 can form simultaneously by adjusting the thickness of layer structures of the light-transmitting display region 103 and the general display region 101, which is beneficial to save the manufacturing processes.

The cathode layer 23 (i.e., a sum of the cathode in the light-transmitting display region 103 and the cathode in the general display region 101) of the OLED display panel 100 has a cathode edge 203, and the cathode edge 203 is located outside the general display region 101. That is, the size of the cathode layer 23 is larger than an area of the display region of the OLED display panel. Parts of the cathode edge 203 located outside the general display region 101 are used to dispose conductive terminals, etc.

In the present embodiment, a first cathode portion 231 and a second cathode portion 232 are disconnected from each other through a groove 234 formed by laser cut. Compared to the cathode layer 23 in prior art covering a whole surface of the OLED display panel 100, the first cathode portion 231 corresponding to the general display region 101 and the second cathode portion 232 corresponding to the light-transmitting display region 103 are formed by laser cutting the groove 234 in the present embodiment.

In the present embodiment, the thin-film transistors 107 are not provided in the light-transmitting display region 103 as far as possible. That is, although the light-emitting pixels included in the organic light-emitting layer 22 are distributed in the general display region 101 and the light-transmitting display region 103, the light-emitting pixels in the light-transmitting display region 103 are driven by the thin-film transistors 107 in the general display region 101. The advantage of this design is to reduce the quantity of metal wires, improve the transmittance of the light-transmitting display region 103, and prevent the metal wires from affecting the light reception of the under-screen camera while shooting.

Figure 4:
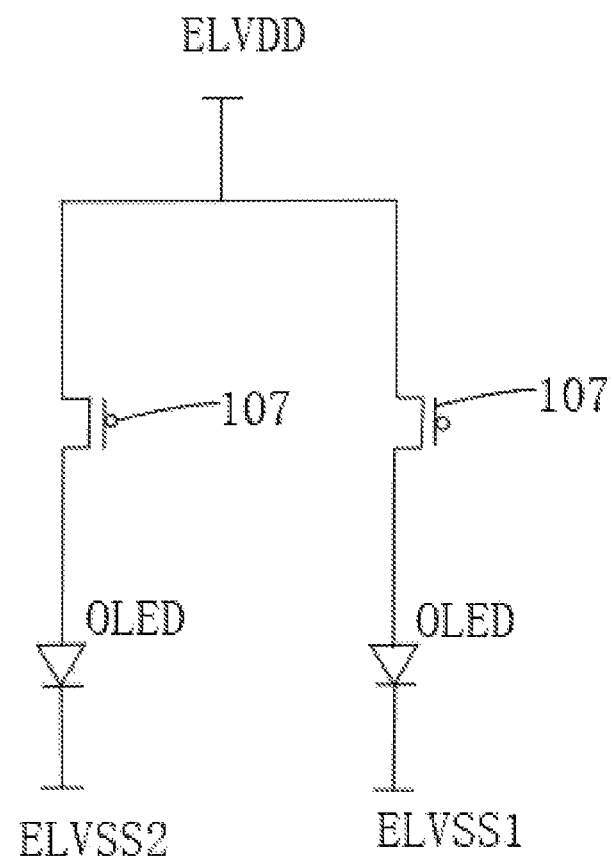
FIG. 4 is a circuit principle diagram of the OLED display panel provided by FIG. 1.

Please refer to FIG. 4 together. In the present embodiment, the OLED display panel 100 is provided with a first wire 150 and a second wire 152 disposed in a structure layer of the bezel region 105, the first wire 150 and the first cathode portion 231 are conductively connected and connected to a first power source ELVSS1, and the second wire 152 and the second cathode portion 232 are conductively connected and connected to a second power source ELVSS2.

More specifically, the first wire 150, the second wire 152, and the source-drain layer 145 are located at the same layer. That is, the first wire 150 and the second wire 152 are formed in a position corresponding to the bezel region 105 while the source-drain layer 145 forming.

In the present embodiment, the first wire 150 and the second wire 152 both surround the general display region 101 and are arranged in parallel and spaced apart from each other, and a projection of the first wire 150 in the bezel region 105 is closer to the general display region 101 than a projection of the second wire 152 in the bezel region 105. That is, the first wire 150 and the second wire 152 are arranged as similar as a concentric ring. The first wire 150 and the second wire 152 both extend from the bezel region 105 to the fan-out region 108, and the first wire 150 and the second wire 152 are respectively connected to a flexible circuit board through the fan-out region 108, thereby providing the first power source ELVSS1 to the first wire 150 and the second power source ELVSS2 to the second wire 152.

Please refer to FIG. 3 together. More specifically, the second wire 152 includes a second left wire 162, a second right wire 164, and a connecting portion 166 located between the second left wire 162 and the second left wire 164. Preferably, a projection of the connecting portion 166 on a display surface of the OLED display panel 100 is provided relative to an upper end of the light-transmitting display region 103. Preferably, a projection of the connecting portion 166 on the display surface of the OLED display panel 100 is directly opposite to the upper end of the light-transmitting display region 103, so that a length of a third wire 242 on an anode layer 20 for conductively connecting to the connecting portion 166 is reduced. Moreover, since the connecting portion 166 is used to function as conductive pads to facilitate connecting a first via hole 214, the line width and the length of the connecting portion 166 both are the sizes that can be set according to the realization of desirable conductive effect. An end of the second left wire 162 and an end of the second right wire 164 are connected to the connecting portion 166 respectively. The anode layer 20 of the light-transmitting display region 103 is conductively connected to the connecting portion 166 through the first via hole 214 provided in the array unit 1. In the present embodiment, since the line width of the second wire 152 is limited, in order to make an upper end and a lower end of the first via hole 214 respectively and conductively connect the second wire 152 and the anode layer 20, and ensure a connecting quality, the connecting portion 166 with a line width larger than the second left wire 162 and the second right wire 164 is disposed between the second left wire 162 and the second right wire 164, so that both ends of the first via hole 214 are connected to the connecting portion 166 and the third wire 242.

The anode layer 20 includes a plurality of anode electrodes 202, 222 spaced apart from each other, the anode electrodes 202, 222 correspond to the light-emitting pixels one by one, and the size of the anode electrode 222 in the light-transmitting display region 103 is smaller than the size of the anode electrode 202 in the general display region 101. This arrangement is to improve the transmittance of the light-transmitting display region 103.

Please refer to FIG. 3 together. In the present embodiment, the anode layer 20 is also provided with the third wire 242, and the third wire 242 can conductively connect the anode electrodes included in the anode layer 20 to achieve the conductive connection between the third wire 242 and the light-emitting pixels. The third wire 242 extends from the light-transmitting display region 103 to the bezel region 105, and the second cathode portion 232 can conductively connect the second wire 152 through the third wire 242 and the first via hole 214 provided in the array unit 1.

In the present embodiment, the first via hole 214 penetrates the flat layer 16 and exposes the connecting portion 166 of the second wire 152. That is, the opposite ends of the first via hole 214 are respectively connected to the connecting portion 166 of the second wire 152, and the third wire 242 at the same layer as the anode layer 20.

The beneficial effects of the present disclosure are as below. Since the OLED display panel 100 provided by the present disclosure includes a general display region 101 and a light-transmitting display region 103, wherein the light-transmitting display region 103 corresponds to an under-screen camera placement region; the OLED display panel 100 further includes an array unit 1 and a light-emitting unit 2 disposed on a surface of the array unit 1, and the light-emitting unit 2 includes a cathode layer 23 disposed on a surface of the array unit 1, wherein the cathode layer 23 includes a second cathode portion 232 corresponding to the light-transmitting display region 103, and a first cathode portion 231 corresponding to the general display region 101, and the second cathode portion 232 and the first cathode portion 231 are disconnected from each other to connect different voltages respectively, so that it can provide an independent power source for light-transmitting display region 103 and achieve a purpose of reducing screen power consumption.

The present disclosure also relates to a manufacturing method of the OLED display panel 100. The manufacturing method includes steps as below.

Step S1 relates to manufacturing an array unit 1. The array unit 1 includes a flexible substrate 10, a buffer layer 12 located on a surface of the flexible substrate 10, an array layer 14 located on a surface of the buffer layer 12, and a flat layer 16 located on a surface of the array layer 14.

The array layer 14 includes a semiconductor layer 140, a first interlayer insulating layer 141, a first metal circuit layer 142, a second interlayer insulating layer 143, a second metal circuit layer 144, a source-drain layer 145, and a flat layer 16. A plurality of thin-film transistors 107 are included in the array unit 1. The source-drain layer 145 includes a source and a drain.

Step S2 relates to forming a light-transmitting metal layer 25 on a surface of the flat layer 16 of the array unit 1 in the light-transmitting display region 103 and pattering the light-transmitting metal layer 25. Certainly, it is understood that a first via hole 214 needs to be formed in a predetermined position before or after the light-transmitting metal layer 25 is formed. For example, a through-hole is formed, and then a conductive adhesive is printed on an inner wall of the through-hole to achieve electrical conductivity of the through-hole. The first via hole 214 is used for subsequent electrical conduction between the third wire at the same layer as the anode layer 20 and the second wire 152 at the same layer as the source-drain layer 145.

Step S3 relates to simultaneously forming the anode layer 20 on a surface of the pattered light-transmitting metal layer 25 and a surface of the flat layer 16 in the general display region 101. The anode layer 20 further includes the third wire 242 extending from the light-transmitting display region 103 to the bezel region 105. That is, the third wire 242 for lapping a second cathode portion 232 is located at the same layer as the anode layer 20, thereby forming the third wire 242 while forming anode electrodes 202 included in the anode layer 20.

S4 relates to evaporating an organic light-emitting layer 22 on a surface of the anode layer 20.

S5 relates to forming a cathode layer 23 on a surface of the organic light-emitting layer 22.

S6 relates to forming a groove 234 in a predetermined position by laser cut. The groove 234 divides the cathode layer 23 into a first cathode portion 231 corresponding to the general display region 101, and a second cathode portion 232 corresponding to the light-transmitting display region 103. The second cathode portion 232 is conductively connected to the second wire 152 through the third wire 242 and the first via hole 214 provided in the array unit 1.

S7 relates to forming a packaging layer 24 on a surface of the cathode layer 23. The packaging layer 24 can fill the groove 234 or not fill the groove 234. In the present embodiment, the packaging layer 24 also covers a surface of the third wire 242 exposed by the cathode layer 23 and a surface of the array unit 1 exposed by the third wire 242.

Embodiment 2

Figure 5:
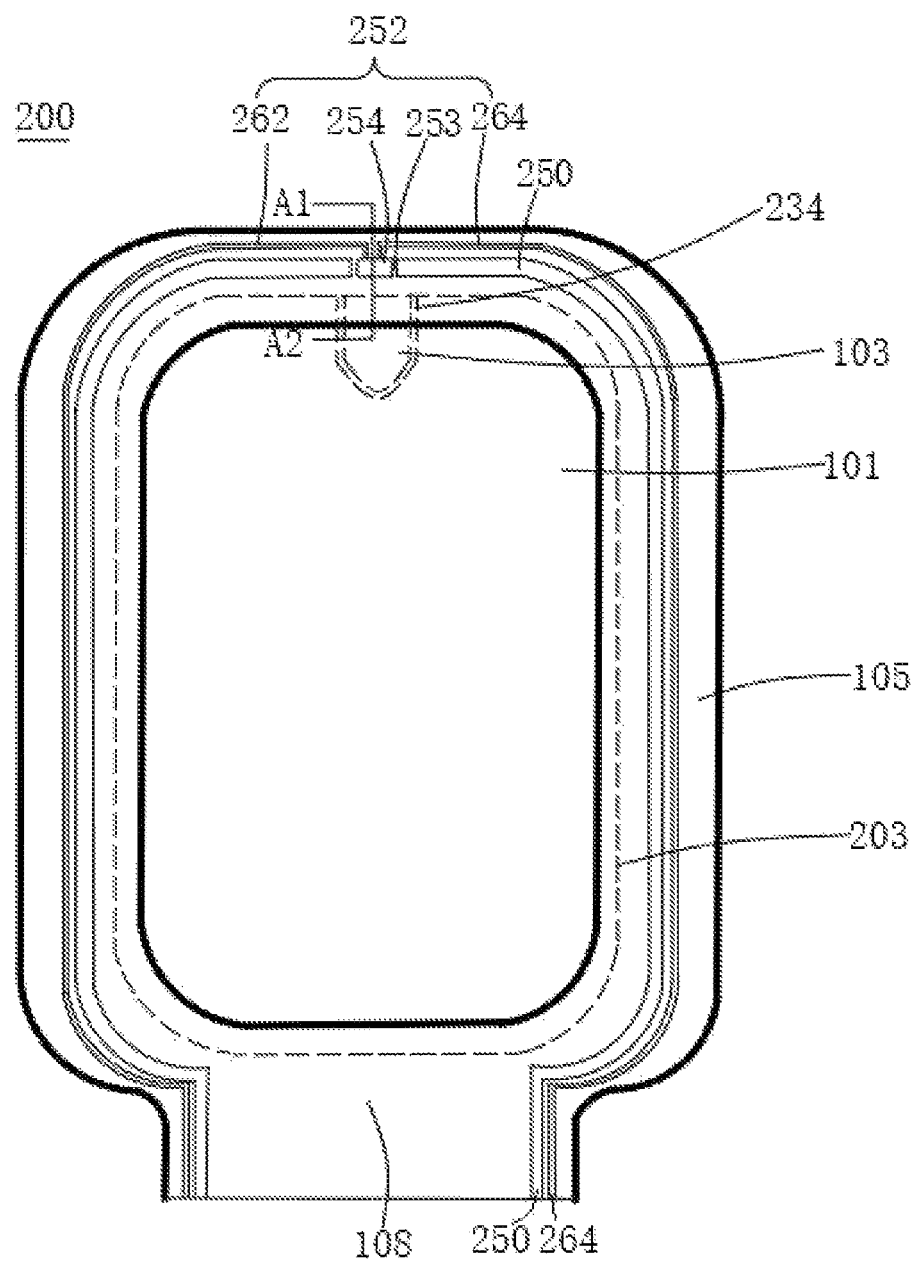
FIG. 5 is a top view of a layer structure included in an OLED display panel provided by a second embodiment of the present disclosure.
Figure 6:
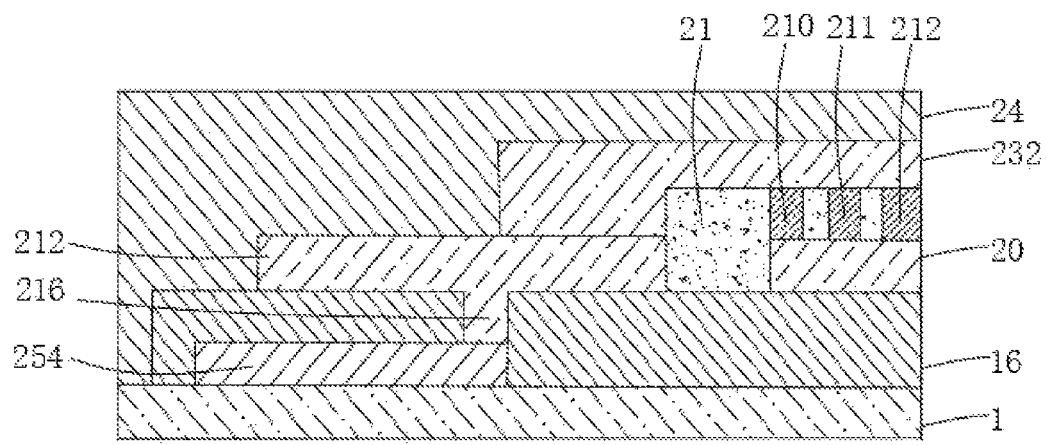
FIG. 6 is a section view along an A1-A2 direction of the OLED display panel provided by FIG. 5.

Please refer to FIGS. 5-6. FIGS. 5-6 show an OLED display panel 200 provided by a second embodiment of the present disclosure. The OLED display panel 200 provided by the second embodiment is basically the same as the OLED display panel 100 provided by the first embodiment, and the difference thereof is as below.

In the present embodiment, the routing form of the first wire 250 and the second wire 252 is slightly different from that of the first embodiment.

Specifically, please refer to FIG. 5. The first wire 250 is provided with an opening 253, and the opening is provided relative to an upper edge of the light-transmitting display region 103. The second wire 252 includes a second left wire 262, a second right wire 264, and a connecting portion 254 located in the opening 253, and a projection of the connecting portion 254 on a display surface of the OLED display panel 200 is provided directly opposite to the upper end of the light-transmitting display region 103. A length of the connecting portion 254 along an A1-A2 direction can be smaller or equal to a width of the light-transmitting display region since the connecting portion 254 is used to function as conductive pads to facilitate connecting a second via hole 216. The line width and the length of the connecting portion 254 both are the sizes that can be set according to the realization of desirable conductive effect. The second left wire 262 and the second right wire 264 extend and connect the connecting portion 254 in the opening 253.

Please refer to FIG. 6. The second cathode portion 232 in the light-transmitting display region 103 is conductively connected to the connecting portion 254 in the opening 235 through the third wire 242 and the second via hole 216 provided in the array unit 1.

Compared to the first embodiment, since the second wire 252 is connected to the connecting portion 254 located at an opening position of the first wire 250, the third wire 242 included in the anode layer 20 only extends over the connecting portion 254 and forms a second via hole 216 in the flat layer 16 from the over position towards the connecting portion 254, so that the second cathode portion 232 is conductively connected to the second wire 252 through the third wire 242 included in the anode layer and the second via hole 216 does not need to cross the first wire 250 when the second wire 252 is connected to the second cathode portion 232. Thus, the wire structure is simple.

In summary, the present disclosure provides an OLED display panel 100, 200 and a display device formed by the OLED display panel 100, 200. The light-emitting unit 2 includes the cathode layer 23 disposed on the surface of the array unit 1. The cathode layer 23 includes the second cathode portion 232 corresponding to the light-transmitting display region 103 and the first cathode portion 231 corresponding to the general display region 101, the second cathode portion 232 and the first cathode portion 231 are disconnected from each other to connect different voltages respectively, so as to reduce screen power consumption.

In summary, although the preferred embodiments of the present disclosure are disclosed above, the preferred embodiments are not intended to limit the present disclosure. Those skilled in the art can make various changes and refinements without departing from the spirit and scope of the present disclosure. Hence, the scope of protection of the present disclosure is based on the scope defined in the claims.

What is claimed is:

1. An organic light-emitting diode display panel, comprising:

a general display region and a light-transmitting display region, wherein the light-transmitting display region corresponds to an under-screen camera placement region;

the organic light-emitting diode display panel further comprises an array unit and a light-emitting unit disposed on an upper side of the array unit, and the light-emitting unit comprises a cathode layer disposed on a surface of the array unit, wherein the cathode layer comprises a first cathode portion corresponding to the general display region, a second cathode portion corresponding to the light-transmitting display region, and the second cathode portion and the first cathode portion are disconnected from each other to connect different voltages respectively.

2. The organic light-emitting diode display panel as claimed in claim 1, wherein a groove is provided between the first cathode portion and the second cathode portion, and the second cathode portion and the first cathode portion are disconnected from each other by the groove.

3. The organic light-emitting diode display panel as claimed in claim 1, wherein the light-transmitting display region is located within a frame region surrounded by the general display region or the light-transmitting display region is located outside the frame region surrounded by the general display region, and the light-transmitting display region and the general display region jointly form one frame region.

4. The organic light-emitting diode display panel as claimed in claim 1, wherein the organic light-emitting diode display panel comprises a bezel region located at an external side of the general display region, a first wire and a second wire are provided in a structural layer corresponding to the bezel region of the organic light-emitting diode display panel, the first wire and the first cathode portion are conductively connected and connected to a first power source, and the second wire and the second cathode portion are conductively connected and connected to a second power source.

5. The organic light-emitting diode display panel as claimed in claim 4, wherein a fan-out region is provided on a side of the bezel region, the first wire and the second wire both extend from the bezel region to the fan-out region, and the first wire and the second wire are connected to the first power source and the second power source respectively through the fan-out region.

6. The organic light-emitting diode display panel as claimed in claim 4, wherein the array unit comprises a source-drain layer, and the first wire, the second wire, and the source-drain layer are located at the same layer.

7. The organic light-emitting diode display panel as claimed in claim 6, wherein the first wire and the second wire are arranged in parallel and spaced apart from each other, and a projection of the first wire in the bezel region is closer to the general display region than a projection of the second wire in the bezel region.

8. The organic light-emitting diode display panel as claimed in claim 7, wherein the light-emitting unit comprises an anode layer, an organic light-emitting layer disposed on a surface of the anode layer, and the cathode layer disposed on a surface of the organic light-emitting layer, wherein the anode layer in the light-transmitting display region comprises a third wire extending from the light-transmitting display region to the bezel region, and the second cathode portion is conductively connected to the second wire through the third wire and a first via hole arranged in the array unit.

9. The organic light-emitting diode display panel as claimed in claim 8, wherein the light-emitting unit further comprises a packaging layer located on a side of the cathode away from the anode layer, and the packaging layer further covers a surface of the third wire exposed by the cathode layer, and a surface of the array unit exposed by the third wire.

10. The organic light-emitting diode display panel as claimed in claim 8, wherein the second wire comprises a second left wire, a second right wire, and a connecting portion between the second left wire and the second right wire, a projection of the connecting portion on a display surface of the organic light-emitting diode display panel is opposite to an upper edge of the light-transmitting display region, and the second cathode portion is conductively connected to the connecting portion through the third wire and the first via hole arranged in the array unit.

11. The organic light-emitting diode display panel as claimed in claim 10, wherein the third wire extends above the connecting portion, a projection of the third wire on the array unit at least partially overlaps a projection of the connecting portion above the array unit.

12. The organic light-emitting diode display panel as claimed in claim 10, wherein the array unit comprises a flexible substrate, a buffer layer located on a surface of the flexible substrate, an array layer located on a surface of the buffer layer, and a flat layer located on a surface of the array layer, wherein the array layer comprises a source-drain layer, and the first via hole penetrates the flat layer and connect the connecting portion.

13. The organic light-emitting diode display panel as claimed in claim 8, wherein the first wire is provided with an opening, the second wire comprises a second left wire, a second right wire, and a connecting portion located in the opening and connecting the second left wire and the second right wire, a projection of the connecting portion on a display surface of the organic light-emitting diode display panel is opposite an upper edge of the light-transmitting display region, and the second cathode portion is conductively connected to the connecting portion through the third wire and a second via hole arranged in the array unit.

14. The organic light-emitting diode display panel as claimed in claim 12, wherein the array unit comprises a plurality of thin-film transistors, the organic light-emitting layer comprises a plurality of light-emitting pixels, the light-emitting pixels are distributed in the general display region and the light-transmitting display region, and the light-emitting pixels in the light-transmitting display region are driven by the thin-film transistors in the general display region.

15. The organic light-emitting diode display panel as claimed in claim 14, wherein the anode layer comprises a plurality of anode electrodes spaced apart from each other, the anode electrodes correspond to the light-emitting pixels one by one, and a size of the anode electrodes in the light-transmitting display region is smaller than a size of the anode electrodes in the general display region.

16. The organic light-emitting diode display panel as claimed in claim 14, wherein the light-emitting unit in the light-transmitting display region further comprises a light-transmitting metal layer located between the array unit and the anode layer, and the light-transmitting metal layer is connected to the light-emitting pixels in the light-transmitting display region and the thin-film transistors in the light-transmitting display region.

17. The organic light-emitting diode display panel as claimed in claim 14, wherein a first conductive hole is provided in the flat layer, and the light-emitting pixels in the general display region are connected to the source-drain layer through the first conductive hole.

18. The organic light-emitting diode display panel as claimed in claim 16, wherein a second conductive hole is provided in the flat layer, and the light-transmitting metal layer is connected to the source-drain layer through the second conductive hole.

19. The organic light-emitting diode display panel as claimed in claim 16, wherein a thickness of the light-emitting unit in the light-transmitting display region is same as a thickness of the light-emitting unit in the general display region.

20. A display device comprising the organic light-emitting diode display panel as claimed in claim 1.

\* \* \* \* \*